United States Patent [19]
Yu

[11] Patent Number: 5,880,488
[45] Date of Patent: *Mar. 9, 1999

[54] SEGMENTED SILICON-CONTROL-RECTIFIER (SCR) ELECTROSTATIC DISCHARGE (ESD) PROTECTION CIRCUIT

[75] Inventor: Ta-Lee Yu, Hsien, Taiwan

[73] Assignee: Windbond Electronics Corp., Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 718,913

[22] Filed: Sep. 25, 1996

[30] Foreign Application Priority Data

May 28, 1996 [TW] Taiwan ................................ 85106311

[51] Int. Cl.⁶ .......................... H01L 29/74; H01L 31/111
[52] U.S. Cl. ............................ 257/111; 257/154; 257/173
[58] Field of Search .................... 257/109, 111, 257/154, 173, 174

[56] References Cited

U.S. PATENT DOCUMENTS

| | | |
|---|---|---|
| 3,662,250 | 5/1972 | Piccone et al. . |
| 4,231,054 | 10/1980 | Ruetsch et al. . |
| 4,244,000 | 1/1981 | Ueda et al. . |
| 4,365,170 | 12/1982 | Okuhara .............................. 307/252 A |
| 4,939,616 | 7/1990 | Rountree .................................. 361/56 |
| 5,012,317 | 4/1991 | Rountre . |
| 5,670,799 | 9/1997 | Croft ........................................ 257/173 |

*Primary Examiner*—Ngân V. Ngô
*Attorney, Agent, or Firm*—Fish & Richardson P.C.

[57] ABSTRACT

A segmented SCR ESD protection circuit for discharging an external electrostatic stress on a semiconductor integrated circuit is formed over a semiconductor substrate. The protection circuit includes an SCR device and a number of resistors. The SCR device is separated into a plurality of SCR segments for suppressing the occurrence of the secondary breakdown. Each of the resistors is connected to one of the SCR segments. The resistors can be in the form of parasitic resistances of the SCR device or in the form of additional electronic components formed on the semiconductor substrate.

11 Claims, 4 Drawing Sheets

SEGMENTED SILICON-CONTROL-RECTIFIER (SCR) ELECTROSTATIC DISCHARGE (ESD) PROTECTION CIRCUIT

BACKGROUND OF THE INVENTION

1. Field of the Invention

The present invention relates to a protection circuit in a semiconductor integrated circuit, and more specifically, to a silicon-control-rectifier (SCR) electrostatic discharge (ESD) protection circuit in a semiconductor integrated circuit.

2. Description of Related Art

Progress in semiconductor technology has decreased the dimensions of many semiconductor devices. With this decrease in semiconductor device dimension, has come an increase in the sensitivity of the device to external signals. For example, most complementary metal-oxide-semiconductor (CMOS) devices have very thin gate oxide layers and shallow junctions to reduce the dimensions of the device and increase the device density in a semiconductor chip, thus increasing the product value of the semiconductor integrated circuit. However, these thin gate oxide layers and shallow junctions cannot withstand high stress. When certain external signals, such as an electrostatic stress, are applied to the CMOS devices, the thin oxide layers and the shallow junctions may be damaged, thereby affecting the performance of the CMOS devices. Therefore, in an integrated circuit which consists of CMOS devices, the input portion must be provided with an ESD protection circuit to prevent electrostatic damage. An ESD protection circuit that includes a silicon-control-rectifier (SCR) is considered to have very good electrostatic discharge performance. Since the SCR ESD protection circuit has a low snap-back holding voltage of about 1–5 volts and a low effective resistance of about 1–3 Ohms, it provides a very good discharge condition for the electrostatic current. However, a secondary breakdown effect occurs in the SCR device when the electrostatic current reaches a certain level. This secondary breakdown effect will damage the SCR device, thus affecting the ESD performance.

Although the SCR protection circuit suffers from the above problem, it discharges the ESD current better than other protection circuits. Therefore, it is very important to prevent the occurrence of the secondary breakdown so as to optimize the ESD performance of the SCR ESD protection circuit.

The secondary breakdown effect in a conventional SCR device will now be described and a new design which can abate the effect can then be provided.

Referring to FIG. 1 in which the top view of a conventional lateral SCR (LSCR) is illustrated, the device includes a cathode which consists of a P-type diffusion region 12 and an N-type diffusion region 14 both in a P-type substrate 10, and an anode which consists of a P-type diffusion region 22 and an N-type diffusion region 24 both in an N-type well 20. The cross-sectional view of the device in FIG. 1 along line II—II is illustrated in FIG. 2. When an electrostatic stress occurs in the anode, a electrostatic discharge path can be formed from the diffusion regions 22 and 24 of the anode diffusion regions to the diffusion regions 12 and 14 of the cathode, through the N-type well 20 and the substrate 10. The discharge path is supposed to be a band path in which the current density distributes uniformly. However, because the substrate material is not perfect and may contain defects, certain positions between the N-type well 20 and the substrate 10 are much weaker than other positions. That is, these positions have lower breakdown voltages. Therefore, if the discharge current density becomes high enough to trigger the breakdown mechanism, the discharge current will concentrate at the certain breakdown positions and increase the current density thereof, as shown in FIG. 1. The abrupt increase in current density tends to result in the secondary breakdown. Moreover, since almost all of the electrostatic current flows through the weak positions of the SCR device in an effect known as the thermal run-away, the device is damaged.

There are various forms of SCR devices, including the LSCR as shown in FIG. 1 and FIG. 2, an MLSCR in which an additional diffusion region is formed between the well and the substrate as shown in FIG. 3, and an LVTSCR in which a transistor is formed between the additional diffusion region and the cathode as shown in FIG. 4. Each of these SCR devices suffers from the same thermal run-away problems and secondary breakdown. As mentioned above, the secondary breakdown occurs when a very high current density exists in the SCR device. In other words, if the electrostatic current in the SCR device is uniformly discharged, the probability that a secondary breakdown will occur can be reduced, thus improving the electrostatic discharge performance.

SUMMARY OF THE INVENTION

Accordingly, the present invention provides a segmented SCR ESD protection circuit to discharge the electrostatic current uniformly, thereby preventing the occurrence of secondary breakdown and improving the ESD performance.

The segmented SCR device of the present invention is applicable to any of a variety of different SCR devices to improve their ESD performance.

The segmented SCR ESD protection circuit of the present invention includes a semiconductor substrate over which a semiconductor integrated circuit is formed so that an external electrostatic stress can be discharged. The protection circuit includes an SCR device and a number of resistors. The SCR device is separated into a plurality of SCR segments to provide a plurality of current paths for uniformly discharging the electrostatic current. Moreover, each of the resistors is connected to one of the SCR segments, thus further reducing the current density in each current path and increasing the uniformity in discharging the current. The resistors can be in the form of parasitic resistances of the SCR device, or in the form of additional electronic components formed on the semiconductor substrate to further eliminate the occurrence of the secondary breakdown.

DETAILED DESCRIPTION OF THE INVENTION

Figure 5:
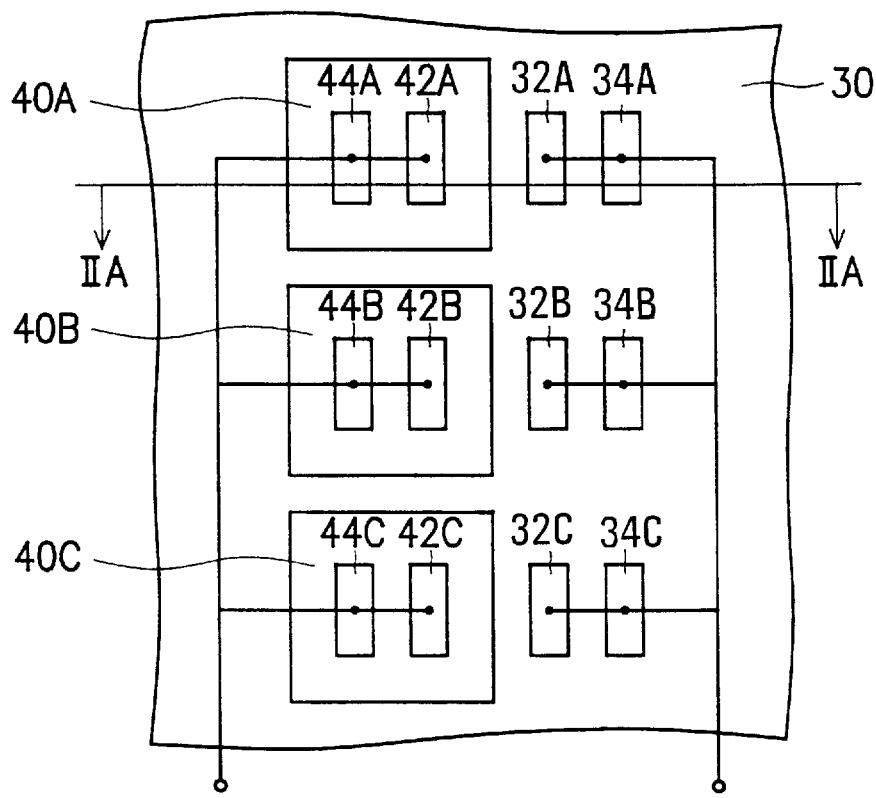
FIG. 5 is the top view of a segmented SCR ESD protection circuit of the present invention.

In the present embodiment, a protection circuit including an LSCR device is separated into a plurality of SCR segments to improve its ESD performance. Referring to FIG. 5, the segmented SCR protection circuit is formed on a semiconductor substrate 30 of a first conductivity type, for example, a P-type silicon substrate. The SCR device has three SCR segments 31A, 31B, 31C connected in parallel as shown in the figure. Each of the segments includes a first diffusion region 34A, 34B or 34C of the first conductivity type and a second diffusion region 32A, 32B or 32C of the second conductivity type formed within substrate 30. Each segment also includes a well 40A, 40B or 40C of the second conductivity type (e.g., N-type silicon), within which a third diffusion region 42A, 42B or 42C of the first conductivity type, and a fourth diffusion region 44A, 44B or 44C of the second conductivity type are formed. The first diffusion regions 34A, 34B and 34C and the second diffusion regions 32A, 32B and 32C of the SCR segments are connected together respectively at a first node of the SCR device, and the third diffusion regions 42A, 42B and 42C and the fourth diffusion regions 44A, 44B and 44C of the SCR segments are connected together respectively at a second node of the SCR device.

Figure 1:
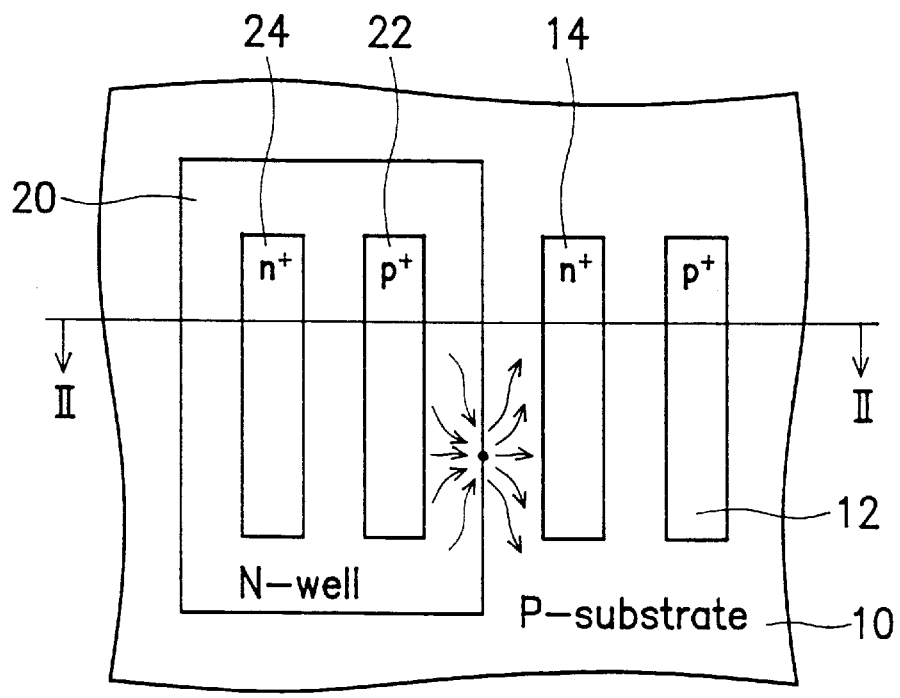
FIG. 1 is a top view of a conventional SCR ESD protection circuit.
Figure 2:
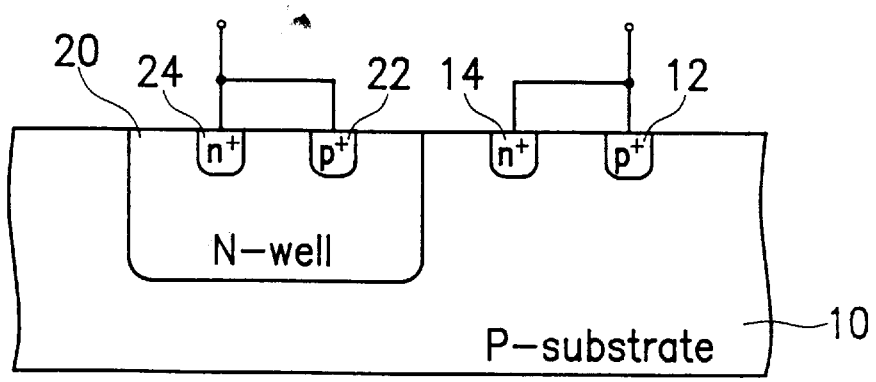
FIG. 2 is a cross-sectional view of the SCR ESD protection circuit in FIG. 1.

The cross-sectional view of the protection circuit in FIG. 5, taken along line IIA—IIA, is similar to that shown in FIG. 2. Therefore, if the first conductivity type is P-type and the second conductivity type is N-type, that is, each SCR segment includes an N-type well in a P-type silicon substrate, the first node serves as the cathode and the second node serves as the anode of the SCR device.

Figure 6:
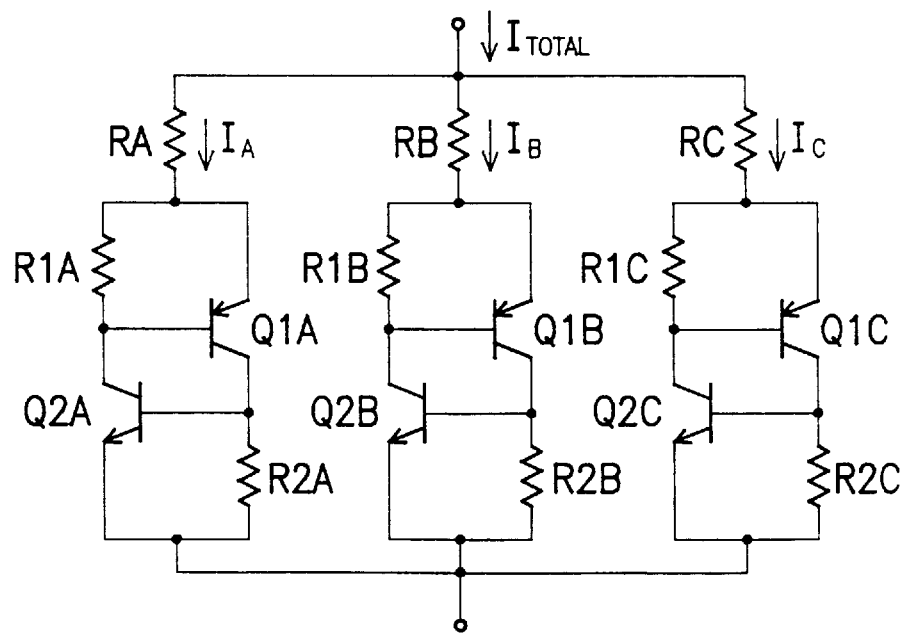
FIG. 6 illustrates an equivalent circuit of the segmented SCR ESD protection of FIG. 5.

As mentioned above, the SCR device of the present invention is separated into a plurality of SCR segments 31A, 31B, 31C which are connected in parallel between the anode and the cathode. When an external electrostatic stress occurs on the anode of the SCR device, a plurality of current paths are provided by the plurality of SCR segments to discharge the electrostatic stress. The equivalent circuit of the SCR protection circuit is illustrated in FIG. 6. The input current $I_{TOTAL}$ applied to the SCR device is separated into three sub-current flows $I_A$, $I_B$ and $I_C$, thus preventing the current from being concentrated along a single path.

Since the SCR device is formed on a semiconductor substrate, the effects of parasitic resistance must be taken into consideration. As shown in FIG. 6, a plurality of resistors R1A, R2A, R1B, R2B, R1C and R2C, are shown representing parasitic resistances of each one of the SCR segments connected between the anode and the cathode of the SCR device. Advantageously, the parasitic resistances can further reduce the current density in each current path. Moreover, the uniformity of the effective resistance in each SCR segment can make the values of $I_A$, $I_B$ and $I_C$ more consistent. That is, the three sub-current flows $I_A$, $I_B$ and $I_C$ will be equal if the three SCR segments have the same effective resistance. Therefore, the electrostatic current can be uniformly distributed in the three SCR segments.

The aforementioned SCR device can suppress the occurrence of secondary breakdown. For example, referring to FIG. 6, if the breakdown voltage of the SCR segment including transistors Q1A and Q2A is lower than the other two SCR segments, the amplitude of the current $I_A$ will dominate the secondary breakdown mechanism of the SCR device. Since the segmented arrangement of the SCR device separates the total current $I_{TOTAL}$ into three sub-current flows whose amplitudes are controlled by the ratio of the resistors in each path, the amplitude of the current $I_A$ can be maintained less than those of the other two sub-current flows. Therefore, it is difficult to reach the critical current amplitude that triggers the secondary breakdown. In order to optimize the uniformity of the current distribution in the segmented SCR device, the resistors connected to each SCR segment, such as RA, RB and RC, can be in the form of additional electronic components formed on the semiconductor substrate. These additional resistors can be formed as diffusion regions in the substrate or as conducting layers over the substrate. The various forms and fabrication methods of these resistors are well-known to those skilled in the art, thus, detailed description of the forms and fabrication methods are omitted.

Although three SCR segments in an SCR device are described in the above embodiment, the number of SCR segments in the SCR device of the present invention is limited only by the critical dimensions of the process, the overall layout, and other practical limitations.

Figure 3:
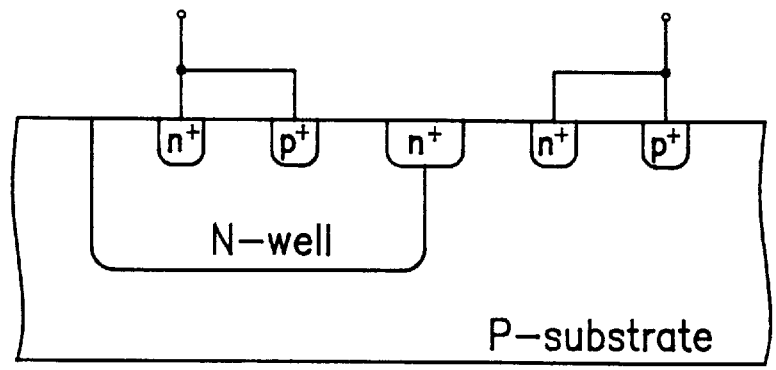
FIG. 3 is a cross-sectional view of a conventional MLSCR protection circuit.
Figure 7:
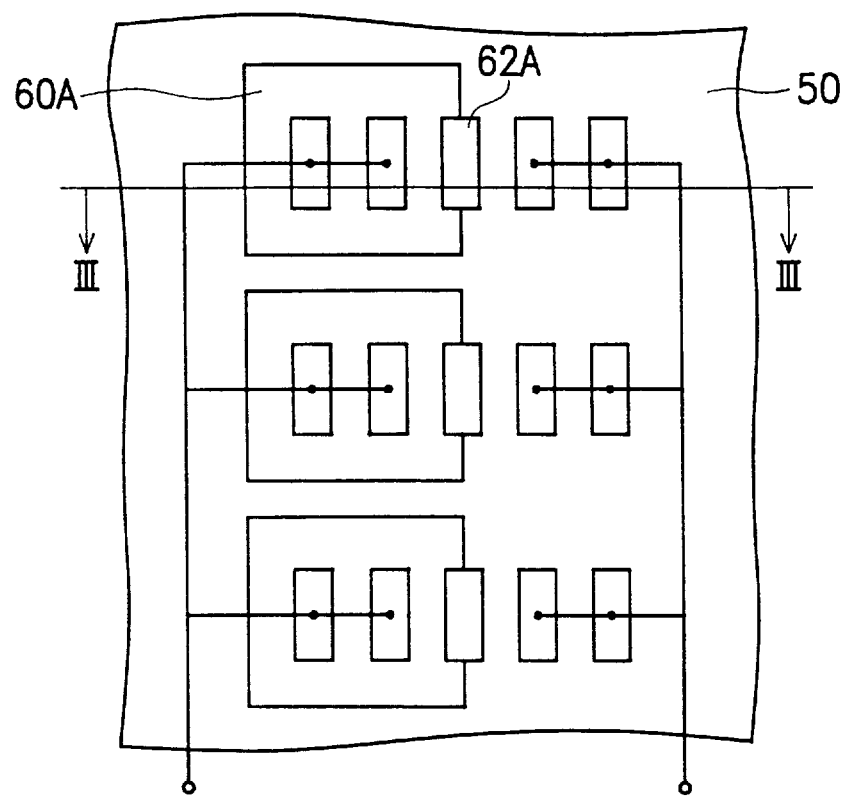
FIG. 7 illustrates the top view of a second embodiment of the segmented SCR ESD protection circuit of the present invention.

Moreover, the segmented design is applicable to a variety of different SCR devices. For example, referring to FIG. 7, a segmented MLSCR device that includes three segments is provided for ESD protection. The segmented MLSCR device is formed on a semiconductor substrate 50 of a first conductivity type. Each segment of the MLSCR device has a well of a second conductivity type, for example, the well 60A, in the substrate 50. In addition to a first, a second, a third and a fourth diffusion region in the well 60A and in the substrate 50, similar to those of the LSCR shown in FIG. 5, a fifth diffusion region 62A is provided between the well 60A and the substrate 50. The cross-sectional view of the MLSCR device along line III—III is similar to the structure of a conventional MLSCR device, as shown in FIG. 3. Therefore, the segmented MLSCR device can uniformly discharge the electrostatic current to prevent secondary breakdown.

Figure 4:
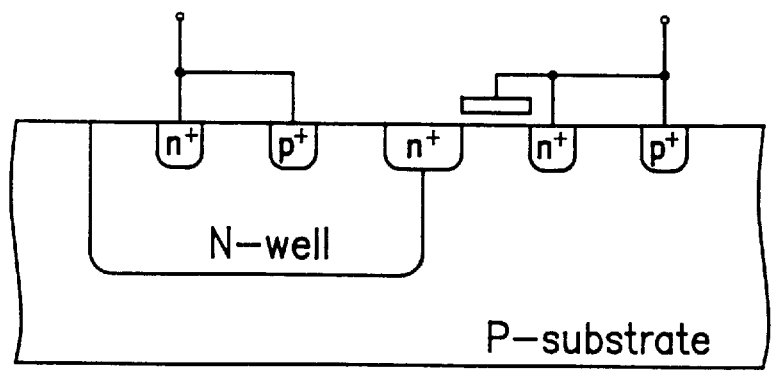
FIG. 4 is a cross-sectional view of a conventional LVTSCR protection circuit.
Figure 8:
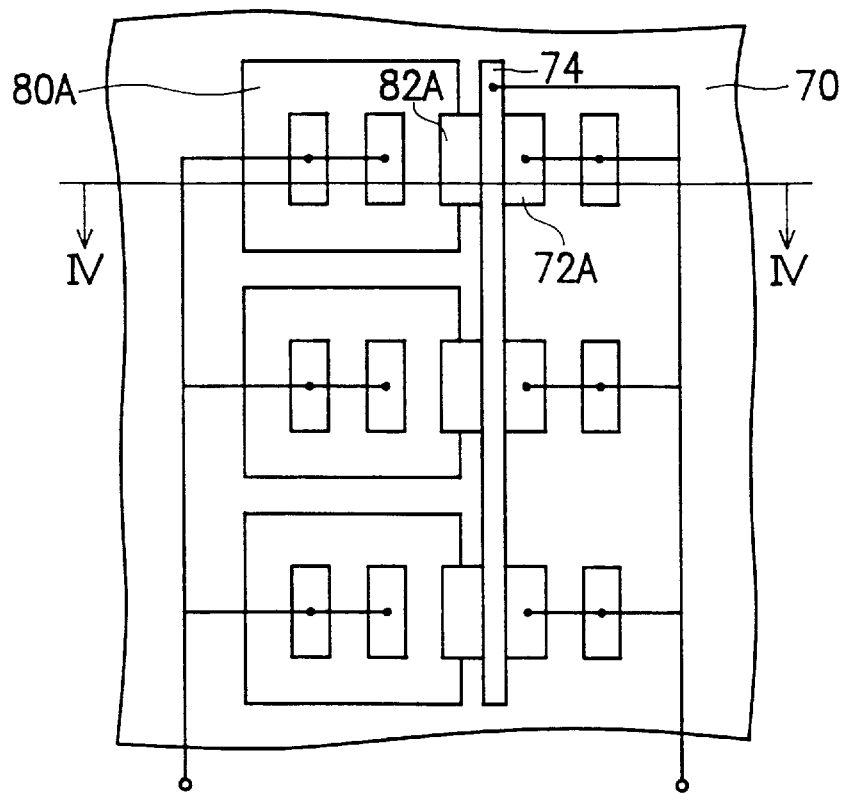
FIG. 8 illustrates the top view of a third embodiment of the segmented SCR ESD protection circuit of the present invention.

Another embodiment of the present invention, referring to FIG. 8, is a segmented LVTSCR ESD protection circuit. The LVTSCR protection circuit which includes three SCR segments is formed on a semiconductor substrate 70 of a first conductivity type. In addition to a first, a second, a third and a fourth diffusion region in a well 80A and in the substrate 50, similar to those of the LSCR shown in FIG. 5, each SCR segment further includes a diffusion region 82A between the well 80A and the substrate 70, and a gate 74 between the diffusion region 82A and the first diffusion region 72A. A cross-sectional view of the LVTSCR device along line IV—IV is similar to FIG. 4. The segmented LVTSCR device can also uniformly discharge the electrostatic current to prevent secondary breakdown.

What is claimed is:

1. A segmented silicon-control-rectifier (SCR) protection circuit formed on a single semiconductor substrate, said protection circuit comprising:
    an SCR device having a first node and a second node, the SCR device comprising a plurality of SCR segments, which are connected in parallel between the first and second nodes, each SCR segment comprising a parasitic resistance, wherein the plurality of parasitic resistances function to increase uniformity in current distribution through the SCR device during operation.

2. The protection circuit as claimed in claim 1, wherein said SCR device further comprises a plurality of electronic component resistors formed on the semiconductor substrate, each connected to a different one of said SCR segments and the first node, wherein the connection between the first node and each SCR segment is through a different one of said electronic component resistors.

3. The protection circuit as claimed in claim 1, wherein the SCR device is a lateral silicon-control-rectifier (LSCR).

4. The protection circuit as claimed in claim 1, wherein the SCR device is a modified lateral silicon-control rectifier (MLSCR).

5. The protection circuit as claimed in claim 1, wherein the SCR device is a low-voltage triggering silicon-control-rectifier (LVTSCR).

6. The protection circuit as claimed in claim 1, wherein the first node is anode and the second node is a cathode.

7. A segmented silicon-control-rectifier (SCR) protection circuit on a single semiconductor substrate of a material of a first conductivity type, the protection circuit comprising a plurality of SCR segments formed on the single semiconductor substrate, each of the segments including
a well of a material of a second conductivity type in the semiconductor substrate;
a first diffusion region of the first conductivity type in the semiconductor substrate;
a second diffusion region of the second conductivity type in the semiconductor substrate;
a third diffusion region of the first conductivity type in the well; and
a fourth diffusion region formed in the second conductivity type in the well;

wherein the first diffusion regions and the second diffusion regions of the SCR segments are connected to a first node of the SCR device, and the third diffusion regions and the fourth diffusion regions of the SCR segments are connected to a second node of the SCR device; and a plurality of resistors, each connected between one of the first and second nodes of the SCR device and a different one of the plurality of SCR segments, wherein the plurality of resistors function to increase uniformity in current distribution through the SCR device during operation.

8. The protection circuit as claimed is claim 7, wherein the first conductivity type is P-type, the second conductivity type is N-type, the first node is a cathode and the second node is an anode.

9. The protection circuit as claimed in claim 7 further comprising a plurality of electronic component resistors formed on the semiconductor substrate, each connected to a different one of said SCR segments and the first node, wherein the connection between the first node and each SCR segment is through a different one of said electronic component resistors.

10. The protection circuit as claimed in claim 7, wherein each of the SCR segments further comprises a fifth diffusion region of the second conductivity type formed between the well and the semiconductor substrate.

11. The protection circuit as claimed in claim 7, wherein each of the SCR segments further comprises a fifth diffusion region of the second conductivity type formed between the well and the semiconductor substrate, and a gate structure formed over the semiconductor substrate between the first diffusion region and the fifth diffusion region.

* * * * *